United States Patent [19]

Charsky et al.

[11] Patent Number: 4,916,259
[45] Date of Patent: Apr. 10, 1990

[54] COMPOSITE DIELECTRIC STRUCTURE FOR OPTIMIZING ELECTRICAL PERFORMANCE IN HIGH PERFORMANCE CHIP SUPPORT PACKAGES

[75] Inventors: Ronald S. Charsky, Binghamton, N.Y.; Leonard T. Olson, Centreville, Va.; David P. Pagnani, Apalachin, N.Y.

[73] Assignee: International Business Machines Corporation, Armonk, N.Y.

[21] Appl. No.: 375,247

[22] Filed: Jul. 3, 1989

Related U.S. Application Data

[63] Continuation of Ser. No. 226,579, Aug. 1, 1988, abandoned.

[51] Int. Cl.[4] .............................................. H05K 1/00
[52] U.S. Cl. .................................... 174/256; 428/435
[58] Field of Search ............... 174/68.5; 361/412, 414; 428/435

[56] References Cited

U.S. PATENT DOCUMENTS

| | | | |
|---|---|---|---|
| 4,446,477 | 5/1984 | Currie et al. | 357/80 X |
| 4,491,622 | 1/1985 | Butt | 174/68.5 |
| 4,496,793 | 1/1985 | Hanson et al. | 174/68.5 |
| 4,640,866 | 2/1987 | Suzuki | 174/68.5 X |
| 4,644,093 | 2/1987 | Yoshihara et al. | 361/397 X |
| 4,679,122 | 7/1987 | Berke, Jr. et al. | 174/68.5 X |
| 4,754,371 | 6/1988 | Nitta et al. | 174/68.5 X |

FOREIGN PATENT DOCUMENTS

224373 10/1959 Australia .......................... 174/68.5

OTHER PUBLICATIONS

Abolafia, O. R. et al., Use of Polyimide to Obtain a Smooth Surface; IBM Technical Disclosure Bulletin; vol. 20, No. 8; Jan. 1978; p. 3020.

Primary Examiner—Morris H. Nimmo
Attorney, Agent, or Firm—Douglas M. Clarkson

[57] ABSTRACT

The disclosure describes a technique whereby the electrical characteristics of an electrical circuit in a package may be adjusted to a predetermined value by changes in the dielectric structure between two levels of circuitry.

This adjustment in the composite dielectric structure is accomplished by changes in the electrical properties of the composite dielectric material, one level being preset to a value and the other level being adjusted by alterations of predetermined amounts that depend upon the performance desired.

6 Claims, 2 Drawing Sheets

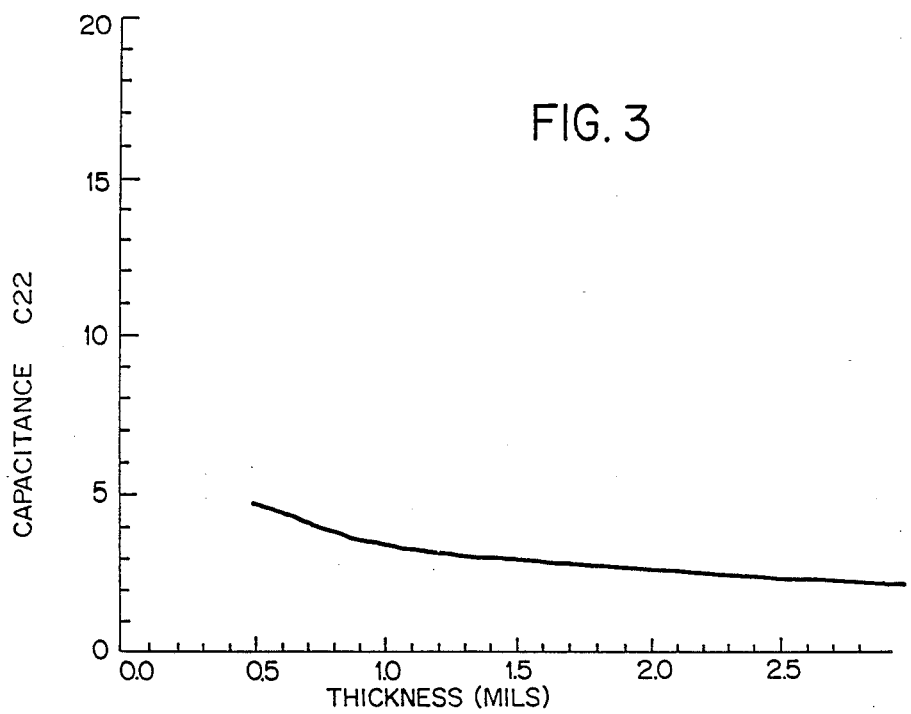
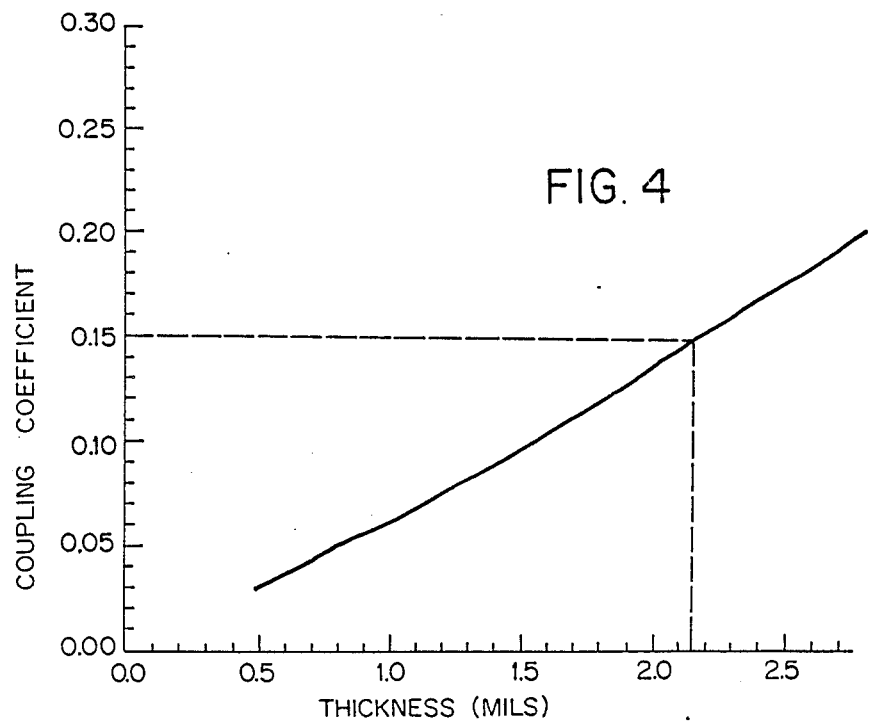

COMPOSITE DIELECTRIC STRUCTURE FOR OPTIMIZING ELECTRICAL PERFORMANCE IN HIGH PERFORMANCE CHIP SUPPORT PACKAGES

This is a continuation of Ser. No. 226,579 filed Aug. 1, 1988, now abandoned.

BACKGROUND

The present invention, generally, relates to the field of packaging for electronic circuits and, more particularly, to a new and improved composite dielectric structure for electronic packaging of circuits and devices.

For conventional modules that utilize a thin film dielectric to separate two metal levels, the flexibility for variation in electrical parameters is extremely limited. For example, one thin film process has a polyimide dielectric thickness equal to 0.36 mils. This structure is characterized by low coupling noise, high drive capacitance and a low impedance.

A typical thin film process is photolithographic in essence and enables the processing of relatively small and refined geometries. In contrast, the typical thick film process is characterized by the use of masks, i.e., moly masks, through which a dielectric material is screened. The thick film process is quite coarse and has a larger geometry relative to the thin film process.

A minimum practical thickness for a layer of dielectric material for the thick film process is 5-mils, with a 1-mil minimum thickness for the metal conductors.

Typically, for the thin film process, the drive capacitance is in excess of 6 Pico-farads per inch for 3 mil wide signal lines and has an impedance of less that 23 Ohms when a solid ground plane is used. The drive capacitance is too high for most circuit technologies, and an impedance as low as 20 Ohms causes reflection problems for the typical 80 Ohms card-on-board applications.

Field of the Invention

The use of a thick film dielectric introduces a different set of concerns. Generally, the minimum "safe" thickness is about 2 mils but 5-mils is the current practical minimum. Multiple layers can be formed on such a thick film as 0.5 mils, but defect holes (such as pin holes) develop below 2 mils, which can cause short circuits between the metal levels.

There are many thick film dielectric paste combinations available that provide a variety of dielectric constants between 5.0 and 8.0, for example, a copper paste available commercially under the tradename Cermalloy 7029d and a glass ceramic dielectric paste that is compatible and available commerically under the tradename Cermalloy No. 7166. Use of the thick film only limits these applications to the low-to-intermediate performance range, due to the distance of the ground plane away from the signals (approximately 5 mils), a higher dielectric constant and a high drive capacitance.

Therefore, it is customary to utilize printed circuit boards that are laminated for multiple layers of circuits as a convenient and low cost method for mounting and for interconnecting discrete electrical components. For example, it is customary for printed circuit boards that are formed on a dielectric substrate to be provided with conductive metallic pathways that define electrical connections between discrete components mounted to be functionally operable with the circuit. The metal leads of any such discrete component are customarily soldered to the conductive pathways to complete the electrical connection.

In the mid 1980s, composites have emerged as new structural materials with a very broad range of engineering applications due to their unique capabilities in performance. Research in advanced composite structures already has generated profound improvements in the technical field of materials engineering.

These composites utilize polymeric, metal or ceramic matrices with high strength and high modulus reinforcements in continuous, discontinuous (e.g., short fibers, whiskers and particulates) or textile forms. However, the expansion of the application of high performance laminated composites is impeded by their limitation in damage tolerance, as well as by manufacturing cost. Considerable effort has been made to focus on these issues, particularly in the field of packaging of electronic devices and circuits, but until the present invention, none has been successful.

An aircraft that takes off from the ground, climbs through the atmosphere into space at hypersonic speeds and survives a scorching descent to land like a conventional airplane is an ultimate test of structural materials. The kinds of demand such an aircraft places on its structure would be extreme but not unprecedented. Already the need for strength combined with low density has led engineers of military and commercial aircraft, sports equipment, automobiles and, now, in the field of electronic packaging, to turn to composites for such structural components.

Wherever advancing technology has created a need for combinations of properties that no single material can provide, composites are becoming the material of choice, On the face of it, a composite might seem a case of needless complexity. However, the makings of ideal structural materials at least for electronic packaging purposes appears to be at hand in the structure provided by the present invention.

The elements that are useful in such structural materials as forming these composite structures include ceramic aluminum oxide (the basic stuff of ruby and sapphire), silicon carbide and silicon dioxide (the basic component of glass). The elements that form electrical conductors are "good" electrical conductors, and the elements that form electrical insulators are "good" insulators. However, because of a serious handicap, some of these elements display characteristics that have been considered unsuitable for the electronic packaging field.

For example, some of these elements are brittle, which means that a small scratch or internal flaw is sufficient to initiate a fatal defect electrically that can result in an electrical short circuit that is impossible to predict and for which it is difficult to test.

Description of the Prior Art

From a search of the prior art, the only U.S. patent that was revealed in Pat. No. 4,496,793 to Hanson et al. entitled "Multi-layer Metal Core Circuit Board Laminate With a Controlled Thermal Coefficient of Expansion". This prior patent emphasizes the use of metal sheets placed between layers of a board laminate to mechanically stabilize and to reduce the effective thermal coefficient of expansion of the laminate. With sufficient reduction of thermal coefficient of expansion, leadless electronic components can be placed physically on the surface, e.g., pinless chip carriers.

The description in the patent centers on a method of lamination that includes epoxy filled apertures to solidify the laminate. Although that description has merit mechanically, it does not relate in any way to the subject invention, as will be understood better as the following detailed description unfolds.

OBJECTS AND SUMMARY OF THE INVENTION

An important object of the present invention is to provide a new and improved structure for a composite dielectric in order to achieve enhanced electrical characteristics and to overcome disadvantages of the prior efforts.

Another important object of the present invention is to provide a structure for a composite dielectric for optimizing the electrical performance of support packages for electronic devices.

Yet another object of the present invention is to provide a new structure that admits to adjusting the electrical properties of a printed circuit by modifying the dielectric composition involved.

Briefly, the composite dielectric structure for use in electronic packages as provided by the present invention involves at least two surfaces, a first surface having electrically conductive elements formed thereon and a second surface having electrically conductive elements formed thereon also, the second surface corresponding to the first surface and arranged substantially parallel to it. A predetermined dielectric material is disposed intermediate of the two surfaces and having a relative dielectric constant that is greater that 1.0. The dielectric material comprises a first material and a second material, whereby the electrical properties of the electronic package are predetermined.

Other objects, features and advantages of the present invention will become apparent as the description proceeds. For a more complete understanding of the nature and objects of the present invention, reference is made to the following detailed description taken in conjunction with the accompanying drawings.

BRIEF DESCRIPTION OF THE DRAWINGS

FIG. 3 is a curve illustrating the relationship between capacitance in a structure in accordance with the present invention and the thickness of the dielectric, for use as part of the detailed description to follow.

FIG. 4 is a curve illustrating the relationship between the electrical noise coupling coefficient and the thickness of the dielectric for use as part of the detailed description to follow.

DETAILED DESCRIPTION OF THE INVENTION

Figure 1:
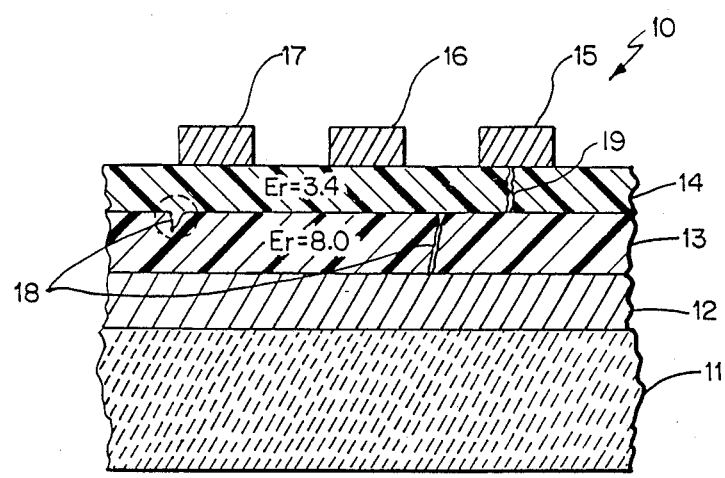
FIG. 1 is a view in vertical cross section of a partial structure illustrating the respective component parts that form a structure of the present invention.

Referring now to FIG. 1 of the drawings, a structure in accordance with the present invention is identified generally by the referenced numeral 10 and consists of a ceramic substrate 11 to support a reference plane 12 which can serve as a power plane or a general ground plane. The ceramic substrate 11, of course, is a dielectric insulation material and, therefore, is non-conductive electrically. On the other hand, the reference plane 12 is formed of electrically conductive material directly on the substrate 11.

Formed directly on and supported by the reference plane 12 is a first dielectric level 13 which, preferably, is formed of a ceramic material. Formed directly on and supported by the first dielectric level 13 is a second dielectric level 14 which, preferably, is a polyimide. Finally, the structure 10 is completed by the circuit conductors 15, 16 and 17 formed directly on and supported by the second dielectric level 14.

It should be noted that the ceramic dielectric material in the first dielectric level 13 can readily develop defects such as pin holes and/or cracks. A pin hole is identified by the referenced numeral 19, and a typical crack is identified by the referenced numeral 18. However, by the formation of the second dielectric level 14 directly over this first dielectric level 13, in accordance with a basic inventive concept, these defects are sealed effectively.

Furthermore, in the formation of the general structure 10, the ceramic dielectric level 13 is formed by multiple layers of ceramic tape, in contrast with the very thin layer of polyimide, forming the second dielectric level 14. This second dielectric level 14 is formed, usually, by spray coating, and its thickness is determined by a manufacturing process limitation.

For example, many manufacturing processes are capable of depositing by spray coating a level of polyimide limited to 0.5 mils in thickness.

On the second dielectric level 14, the printed circuit is formed which is represented in FIG. 1 by the bars 15, 16 and 17. By this configuration, the elements of a printed circuit are separated from a power plane 12 by the first and second dielectric levels 13 and 14.

As shown in FIG. 1, the thickness of the second dielectric level 14, formed of polyimide, is less than 0.0004 of an inch (0.00035 inch). The thickness of the first dielectric level 13, since it is made up of discrete layers of material, is variable and, therefore, is controllable.

Figure 2:
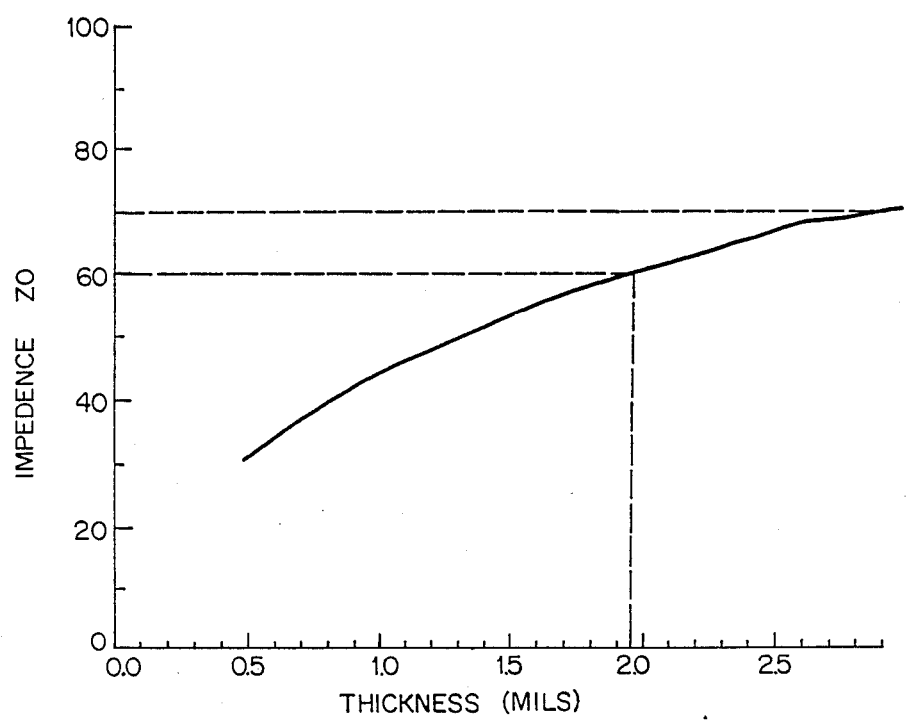
FIG. 2 is an impedance curve used in conjunction with the structure of the present invention as will be explained in more detail as part of the description to follow.

To select the total thickness of dielectric between the printed circuit 15, 16 and 17 and the power plane 12, reference is made to FIG. 2 of the drawings. This shows a curve of the relationship between impedance and the thickness in mils.

In other words, knowing a desired impedance between the printed circuit 15, 16 and 17 and the power plane 12, and knowing the thickness of a polyimide layer 14 from information obtained from manufacturing as to the ability to spray a certain thickness of polyimide on any other layer, a total impedance between the two can be obtained readily with this structure in accordance with the invention by utilizing the curve of FIG. 2. By following the impedance needed across to the curve and looking down to the x axis will reveal the required thickness of the first dielectric level 13.

Similarly, knowing the desired capacitance between the printed circuit 15, 16 and 17 and the power plane 12, referenced to the curve in FIG. 3 will reveal quickly the needed thickness in mils for the variable thickness ceramic dielectric 13. Alternatively, or supplementing the above information, the curve in FIG. 4 will reveal the required thickness of the first dielectric layer 13 to obtain a desired coupling coefficient.

If, for example, the following electrical requirements are required, the graphs of FIGS. 2 and 4 are used to obtain the necessary thickness of the thick film dielectric, like this:

Assume that an impedance in the 60–70 Ohm range is needed, with an electrical noise coupling coefficient less than 0.15. Using FIG. 2, the impedance range constrains the dielectric thickness to the 1.95 to 2.92 mil range.

Now, using FIG. 4 and the requirement that noise coupling be less than 0.15, it is found that the dielectric thickness must be less than 2.15 mils. The net result is an acceptable dielectric thickness of 1.95 to 2.15 mils which satisfies the design requirements. If a deposit of the dielectric in 0.5 mil increments is achievable, the final dielectric thickness is selected at 2.0 mils.

With a structure in accordance with the present invention, the following advantages are available:
(1) variable impedance (20 Ohms to 80 Ohms);
(2) variable capacitance (the line capacitance);
(3) low coupling noise—variable control (why the range tradeoff is possible);
(4) defects are sealed by the polyimide layer;
(5) less sensitive to process tolerances;
(6) signal conductors are imbedded in a lowest dielectric sandwich (polyimide/air).

Typically, the thick film process can be deposited in 0.5 mil thick layers but must have a final thickness greater than 2 mils to minimize defects. This thickness results in a moderate load capacitance but considerable amount of coupling noise.

While a structure in accordance with the present invention has been described in substantial detail, various modifications can be made by one skilled in the art. However, it is understood that all such modifications that fall within the spirit and scope of the claims appended hereto are within the invention.

I claim:

1. A composite structure for an electronic package when electrical impedance or capacitance of a thin film dielectric component part between two metallic levels is predetermined, comprising:
   a substrate of electrically non-conductive material providing a first surface with electrically conductive elements deposited thereon for functioning as a reference plane;
   a dielectric component part providing a second surface with electrically conductive elements deposited thereon for functioning as circuit conductors, said second surface being arranged substantially parallel to said first surface; and
   said dielectric component part being located intermediate said reference plane and said circuit conductors, said dielectric component part having a relative dielectric constant greater than 1.0 and comprising:
     a first layer of a ceramic material having a thickness composed of a predetermined number of discrete layers; and
     a second layer of a polyimide material having a thickness composed of a predetermined number of spray coated layers of polyimide, each layer having a thickness less than 0.0004 inch;
   whereby the electrical impedance or capacitance of said dielectric component part is predeterminable.

2. A composite dielectric structure having predetermined electrically insulating characteristics for use in thin film electronic packages when electrical impedance or capacitance is predetermined, comprising:
   a first layer formed of discrete elements of a preselected electrically insulating material having a first, predetermined dielectric property; and
   a second spray coated layer of a preselected electrically insulating material having a second, predetermined dielectric property;
   whereby a composite structure with desired predetermined electrical impedance or capacitance characteristics is formed for thin film packaging of electronic components.

3. A composite dielectric structure as defined in claim 2 wherein said first layer is in the form of ceramic tape having predetermined electrically insulating characteristics.

4. A composite dielectric structure as defined in claim 2 wherein said second spray coated layer is formed directly on and is supported by said first layer of discrete elements.

5. A composite dielectric structure as defined in claim 2 wherein said first layer of electrically insulating material is ceramic.

6. A composite dielectric structure as defined in claim 2 wherein said second layer of electrically insulating material is polyimide.

* * * * *